United States Patent [19]
DeWalch

[11] Patent Number: 5,870,911
[45] Date of Patent: Feb. 16, 1999

[54] ELECTRIC METER BOX LOCK

[76] Inventor: Norman Binz DeWalch, 6850 Wynnwood, Houston, Tex. 77008

[21] Appl. No.: 589,782

[22] Filed: Jan. 22, 1996

[51] Int. Cl.[6] .................................................. B65D 55/14
[52] U.S. Cl. .................................... 70/159; 70/63; 70/77; 70/379 R; 70/DIG. 34
[58] Field of Search ............................. 70/159, 160, 161, 70/125, 127, 128, 132, 139, 386, 368, 32–34, 94, 63, 232, DIG. 19, DIG. 34, DIG. 57, DIG. 64, 70, 84, 64, 379 R, 371, 361; 292/206

[56] References Cited

U.S. PATENT DOCUMENTS

| | | | |
|---|---|---|---|
| 1,268,503 | 6/1918 | Shaw | 70/379 R |
| 1,918,411 | 7/1933 | Lowe | 70/223 |
| 2,313,712 | 3/1943 | Jacobi | 70/84 |
| 2,399,812 | 5/1946 | Ledin | 70/84 |
| 2,580,894 | 1/1952 | De Hoffman | 70/361 |
| 4,474,041 | 10/1984 | Finck, Jr. | 70/159 |
| 4,475,365 | 10/1984 | Swisher | 70/63 |
| 4,551,999 | 11/1985 | Guiler | 70/159 |
| 4,751,831 | 6/1988 | Morris, Jr. et al. | 70/34 |
| 5,007,258 | 4/1991 | Mahaney | 70/159 |
| 5,103,659 | 4/1992 | Benefield, Sr. | 70/423 |
| 5,114,193 | 5/1992 | Nass | 292/DIG. 71 |
| 5,263,348 | 11/1993 | Wittwer | 70/223 |
| 5,315,849 | 5/1994 | Georgopoulos | 70/63 |

OTHER PUBLICATIONS

Dead–bolt Locking Device Product Data and Installation Instructions Inner–Tite Corp. Aug. 1992.

Swing Guard Lock Product Data and Field Instructions E.J. Brooks Company Apr. 1987.

*Primary Examiner*—Darnell M. Boucher
*Attorney, Agent, or Firm*—Jeffrey M. Davis

[57] ABSTRACT

A lock for meter boxes and similar enclosures includes an outer case with a central bore mounted on an electric meter box. Inside the bore are two extrusions of unequal length spaced 90 degrees apart. A sleeve having a deep bore is held in the case by a screw, and a spring assembly transmits motion from the screw to the sleeve. The sleeve includes a flange at its end with an arcuate cutout portion which spans both extrusions. The sleeve further includes several internal grooves for retaining a barrel type lock which prevents access to the screw. A heavy cover plate is welded to the top of the sleeve so that it overlays and retains the door of the meter box. To unlock the meter box lock, the barrel lock is removed to allow access to the screw. As the screw is unscrewed, the sleeve moves with the screw until the flange on the sleeve clears the shorter extrusion. The sleeve then rotates with the screw until the flange engages the longer extrusion. In this position, the cover plate no longer overlays the door, and the door can be opened.

16 Claims, 10 Drawing Sheets

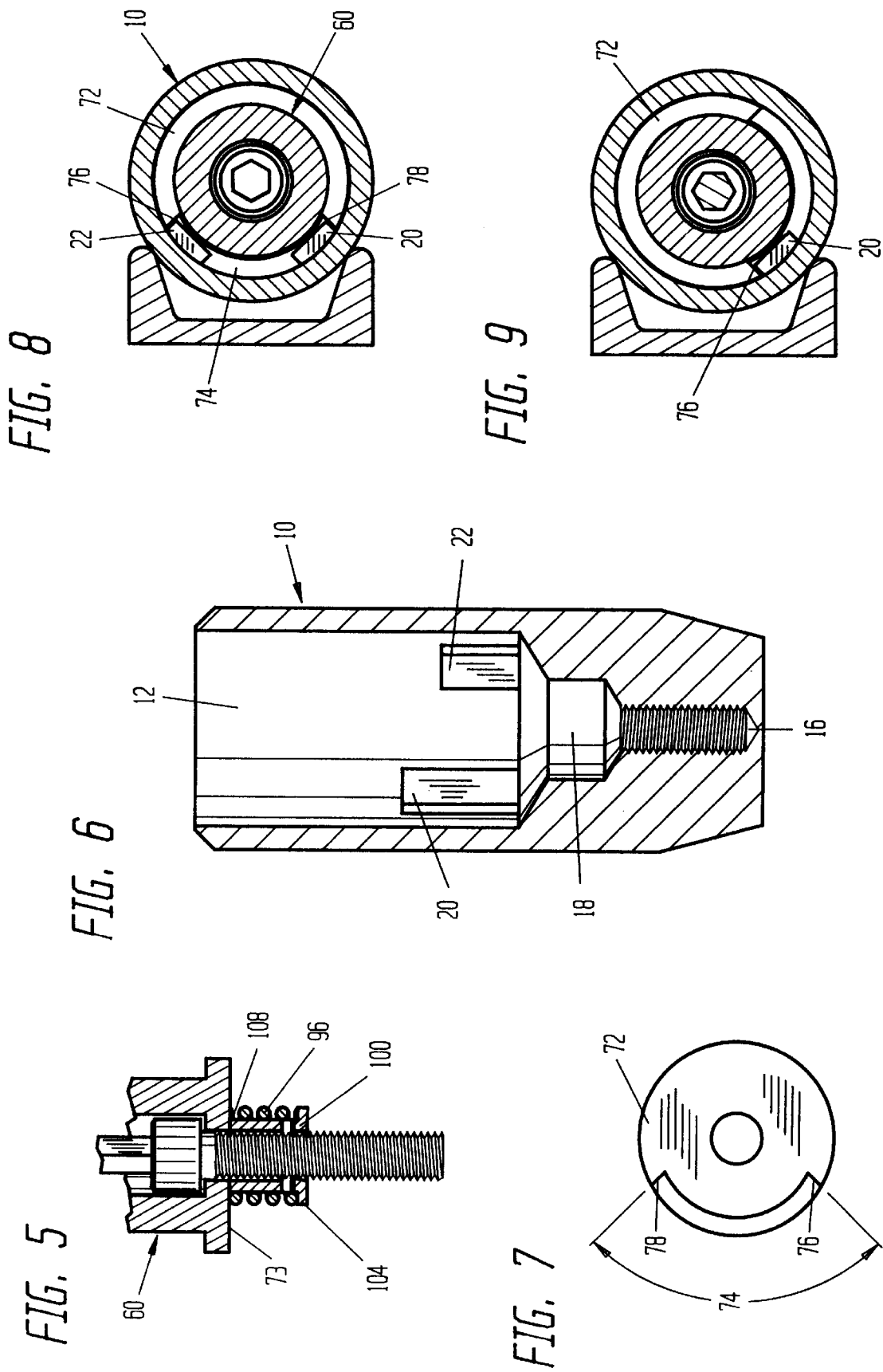

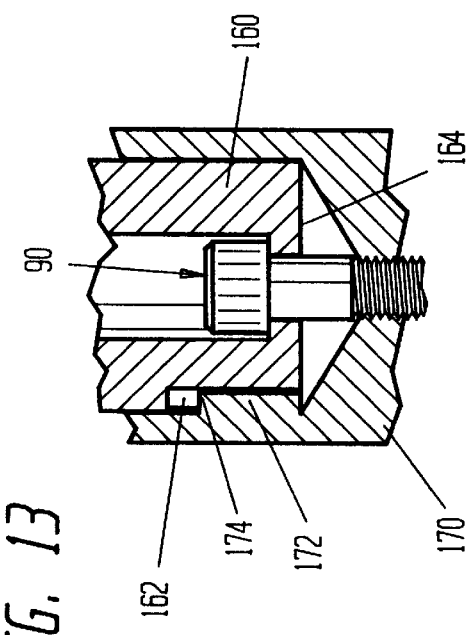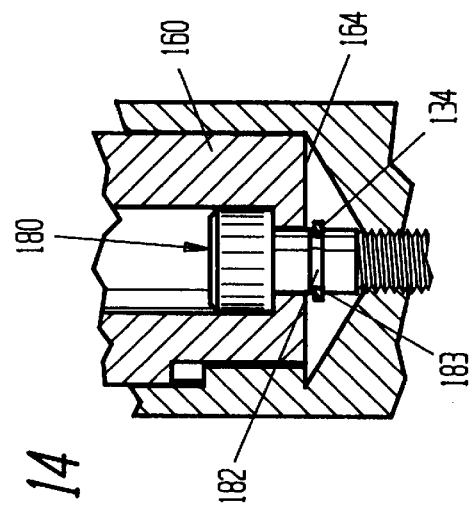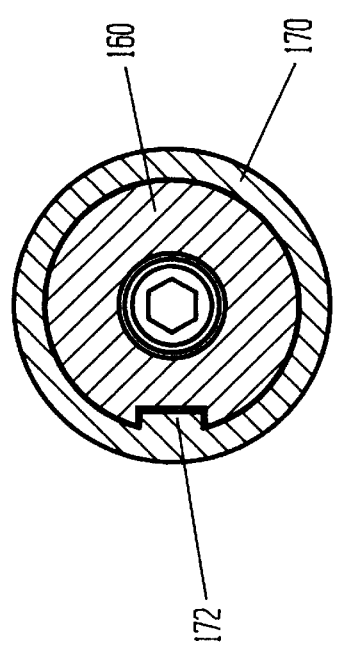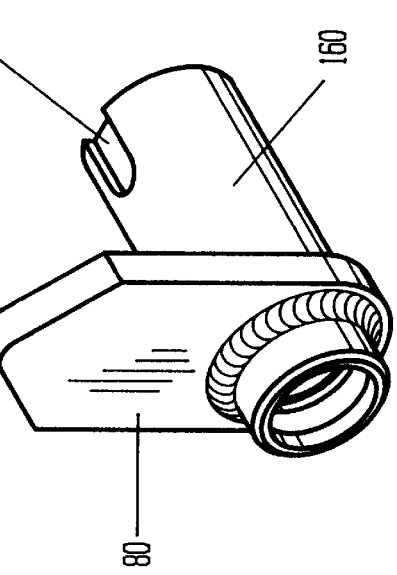

ELECTRIC METER BOX LOCK

BACKGROUND

1. Field of the Invention

This invention relates to locks, and more specifically to an improved locking device for electric meter boxes and similar enclosures.

2. Problems Addressed by the Invention

In the electric utility industry, many electricity meters are mounted in meter boxes, with the door or cover of the meter box retaining the meter in the meter socket. Due to the increasing incidence of power theft via meter tampering, it is necessary for the utility companies to prevent unauthorized access to the electricity meters. Thus there is a need for a secure and reliable locking device for retaining the doors of the meter boxes in the closed position. Because a large number of these meter boxes are already in use, the locking device must be easily installed in the field. Many of these meter boxes are in closely spaced "gang" installations; therefore the locking device must operate properly with a minimal amount of clearance between meter boxes. Lastly, the locking devices must be inexpensive and easy to use, since some utility companies must cost effectively maintain millions of meters.

DISCUSSION OF PRIOR ART

A variety of locking devices have been developed for securing electricity meter boxes or similar enclosures. In general, these devices usually include a bracket member which is detachably coupled, by various means, to a base member. The base member is mounted to the side of the meter box, usually with a standard hex head cap screw. When the locking device is locked, part of the bracket member overlays a portion of the door to prevent opening thereof. A barrel type lock, such as the one shown in U.S. Pat. No. 4,742,703 (1988, DeWalch et al.), is usually used to prevent opening of the locking device.

During field installations, the position of the base member on the meter box is bound to vary. Many existing meter box locks cannot be adjusted to account for these positional variations, resulting in locks which are (a) too loose, which compromises security, or (b) too tight, which requires reinstallation. Both of these scenarios are costly and therefore undesirable. Locking devices of this type are shown in U.S. Pat. Nos. 4,254,647 (1981, Finck, Jr.), 4,414,829 (1983, Nielsen, Jr. et al), and 4,107,959 (1978, Skarzynski et al). Other examples include the "Swing Guard" lock sold by E. J. Brooks Company and shown in their product literature, and the deadbolt locking device sold by Inner-Tite Corp. and shown in their product literature.

In many meter box locks, the bracket member must be completely separated from the base member in order to open the meter box. Locking devices of this type are shown in U.S. Pat. Nos. 4,080,811 (1978, Nielsen, Jr.) and 4,144,729 (1979, Nielsen, Jr.), and also in Skarzynski et al, and Finck. When using any of these devices, the operator must remove and replace the bracket member, and thus handle more parts, every time the meter box is opened. This makes the locks unwieldy and their operation time consuming and costly.

In order to open the meter box locking devices shown in Skarzynski et al, and Finck, the bracket member must slide away from the meter box in a direction perpendicular to the side of the meter box. Thus additional clearance equal to the width of the bracket member is required between the meter boxes in order for these designs to be used in gang installations. In the Brooks "Swing Guard" lock the bracket member rotates about an axis which is parallel to the edge of the door and located at the bottom of the bracket member. Thus additional clearance equal to the height of the bracket member is required between the meter boxes in order for this design to be used in gang installations. In the Inner-Tite deadbolt device, the bolt must slide away from the meter box in a direction perpendicular to the side of the meter box. Thus additional clearance is required between the meter boxes equal to the length of the portion of the bolt which covers the door. Neither of these devices allows for variations in the mounted position of the base member on the meter box.

SUMMARY OF THE INVENTION

Objects of the Invention

Accordingly, several objects and advantages of the present invention are:

(a) to provide a meter box locking device which is resistant to tampering.

(b) to provide a meter box locking device which can be easily operated.

(c) to provide a meter box locking device which can be easily adjusted for positional variations during installation.

(d) to provide a meter box locking device which requires minimal clearance between adjacent meter boxes.

Brief Physical Description

The meter box lock of the present invention includes an outer case having a central bore with a tapped hole at the bottom. The outer case is welded to a "C" shaped mounting channel to form the base member, which is then bolted to the sidewall of an electric meter box or similar enclosure, so that the bore opening faces the side of the box on which the door or cover is mounted. On the inside diameter of the bore near its bottom are two elongated extrusions spaced about 90 degrees apart. The counterclockwise-most extrusion is longer and extends farther toward the bore opening than the other extrusion.

A heavy cover plate is welded to the top of a cylindrical sleeve to form the bracket member. The sleeve has a deep bore and a smaller diameter through hole at the bottom, and is held in the case by a screw. A spring and bushing assembly mounted on the screw just below the sleeve transmits both torsional forces and axial motion from the screw to the sleeve. The sleeve, which is smaller in diameter at its lower end so that it clears the extrusions in the case, includes a radially extending flange at its extreme lower end with an arcuate cutout portion therein which is just large enough to span both extrusions. The sleeve further includes several grooves on the inside diameter of the deep bore, which allow it to retain a barrel type lock. The cover plate overlays the door of the meter box and serves to retain door in the closed position.

When the meter box lock is locked, the sleeve is screwed into the case until the cover plate is tight against the meter box door. The barrel lock is then installed in the sleeve to prevent unauthorized access to the screw. To unlock the meter box lock the barrel lock is removed and the screw is unscrewed. The sleeve moves axially with the screw, until the flange on the sleeve clears the shorter extrusion in the case. The sleeve then rotates approximately 90 degrees with the screw until the flange engages the longer extrusion. In this position, the cover plate no longer overlays the door, and the door can be opened.

Present Invention vs. Prior Art

The meter box lock of the present invention is easier to use than the devices shown in U.S. Pat. Nos. 4,080,811

(1978, Nielsen, Jr.), 4,144,729 (1979, Nielsen, Jr.), Skarzynski et al, and Finck. When using any of these locks, the operator must remove and replace the bracket member every time the meter box is opened. In the present invention the sleeve rotates within the case but is not removed from the case during normal operation, so that no disassembly is required. Furthermore, the cover plate and sleeve move with the screw, so that the operator only needs to turn the screw to open and close the lock.

The meter box lock of the present invention is more easily adjusted for positional variations than the devices shown in U.S. Pat. No. 4,414,829 (1983, Nielsen, Jr. et al), Skarzynski et al, and Finck. The lock of the present invention is also more easily adjusted than the Brook's "Swing Guard" lock and the Inner-Tite deadbolt lock. Proper operation of these locks is dependent on precise positioning of the base member on the meter box. In the present invention, the final position of the cover plate can be continuously adjusted via the screw.

Finally, the meter box lock of the present invention requires less clearance between adjacent meter boxes than the devices shown in Skarzynski et al, and Finck, and also the Inner-Tite deadbolt lock. All of these locks require additional clearance for the bracket member to slide away from the meter box in order for the box to be opened. The lock of the present invention also requires less clearance the Brook's "Swing Guard" lock, which requires additional clearance for the bracket member to swing away from the meter box. The present invention requires no more clearance in the open position than it does in the closed position.

How the Present Invention Fulfills the Objects

All the components of the meter box lock of the present invention are constructed of case hardened steel to resist cutting or sawing. The cover plate is made of heavy gage flat stock to prevent bending by prying. The locking device of the present invention is easy to use because the lock remains assembled during normal operation, and the cover plate moves with the screw to its locked or unlocked position. The cover plate position is continuously adjustable via the screw, making installation position less critical. Finally, the sleeve rotates within the case to move the cover plate to the open position. Thus, the lock requires no additional clearance between the meter boxes.

DESCRIPTION OF THE DRAWINGS

FIG. 5 shows a cross-sectional side view of the preferred embodiment meter box lock with the bushing bearing on the sleeve.

FIG. 6 shows a cross-sectional end view of the outer case.

FIG. 7 shows a bottom view of the sleeve.

FIG. 8 shows a cross-sectional top view of the preferred embodiment meter box lock in the locked position.

FIG. 9 shows a cross-sectional top view of the preferred embodiment meter box lock in the unlocked position.

FIG. 11 shows a cross-sectional top view of an alternative embodiment meter box lock having a single extrusion and no spring or snap ring.

FIG. 12 shows a isometric view of the sleeve and cover plate portions of the meter box lock shown in FIG. 11.

FIG. 13 shows a partial cross-sectional side view of the meter box lock shown in FIG. 11.

FIG. 14 shows a partial cross-sectional side view of an alternative embodiment meter box lock having a single extrusion, a snap ring, and no spring.

DETAILED DESCRIPTION OF THE PREFERRED EMBODIMENT

Figure 1:
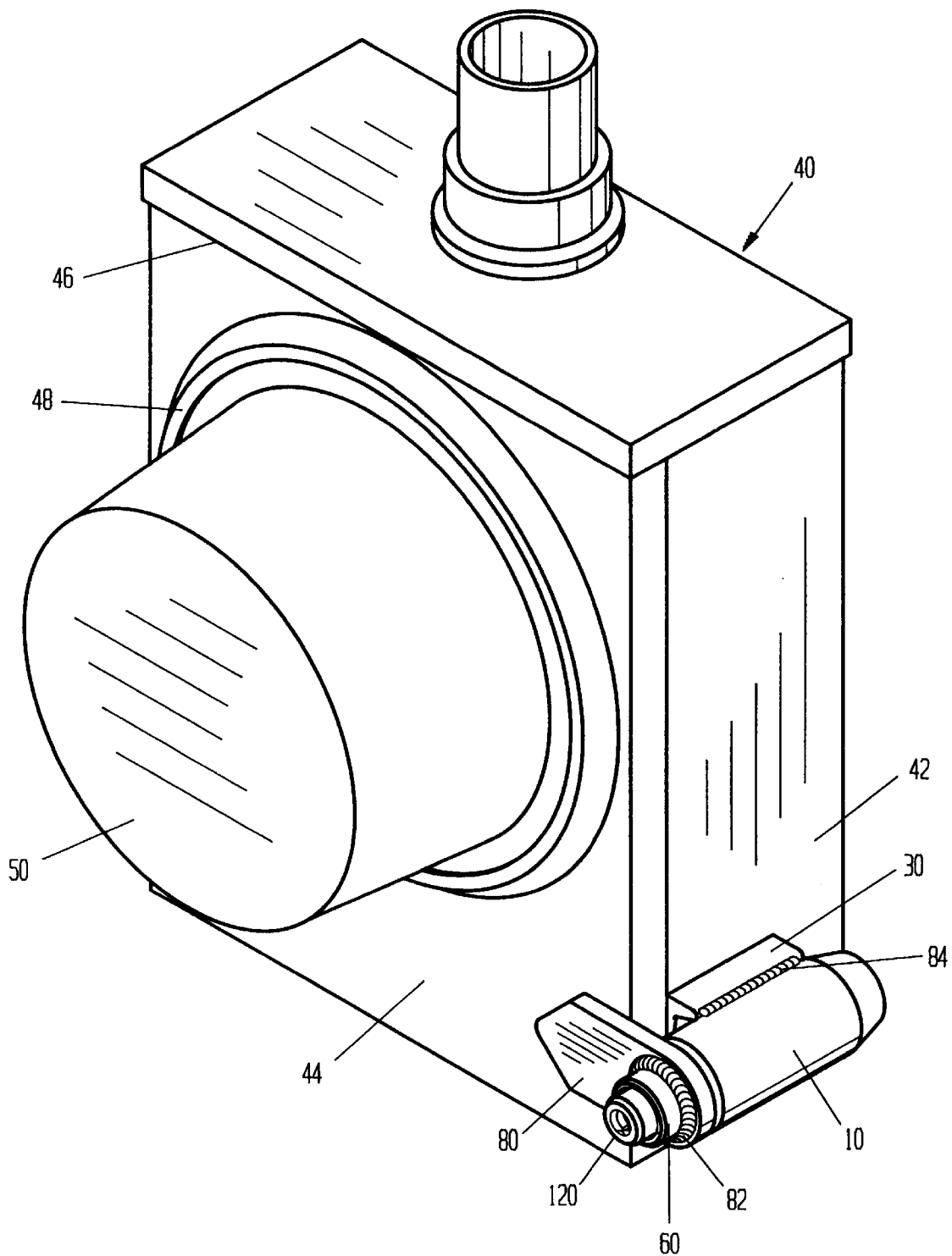
FIG. 1 shows the preferred embodiment meter box lock and a barrel lock installed on an electric meter box.
Figure 2:
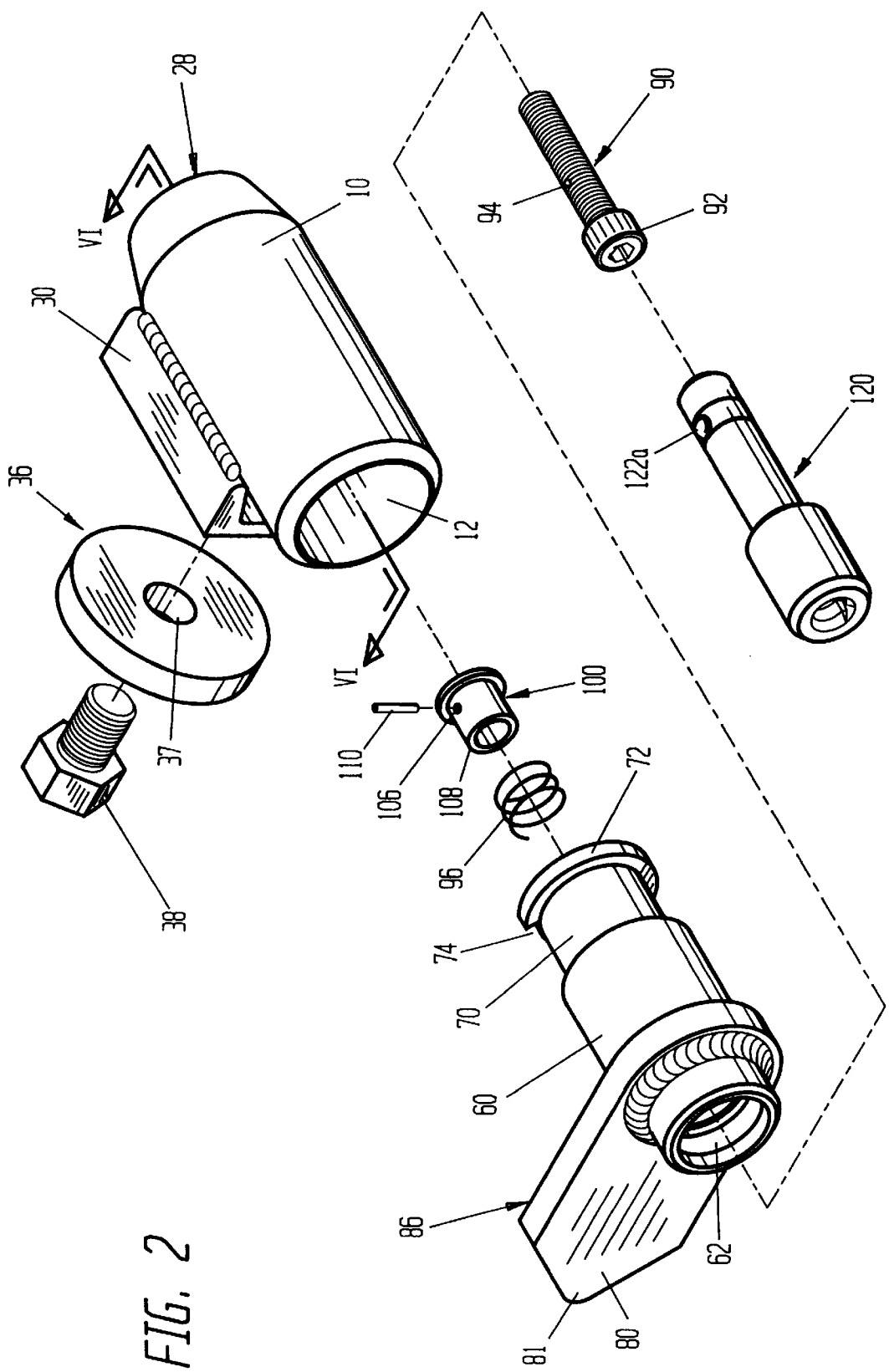
FIG. 2 shows an exploded isometric view of the preferred embodiment meter box lock and a barrel lock.
Figure 3:
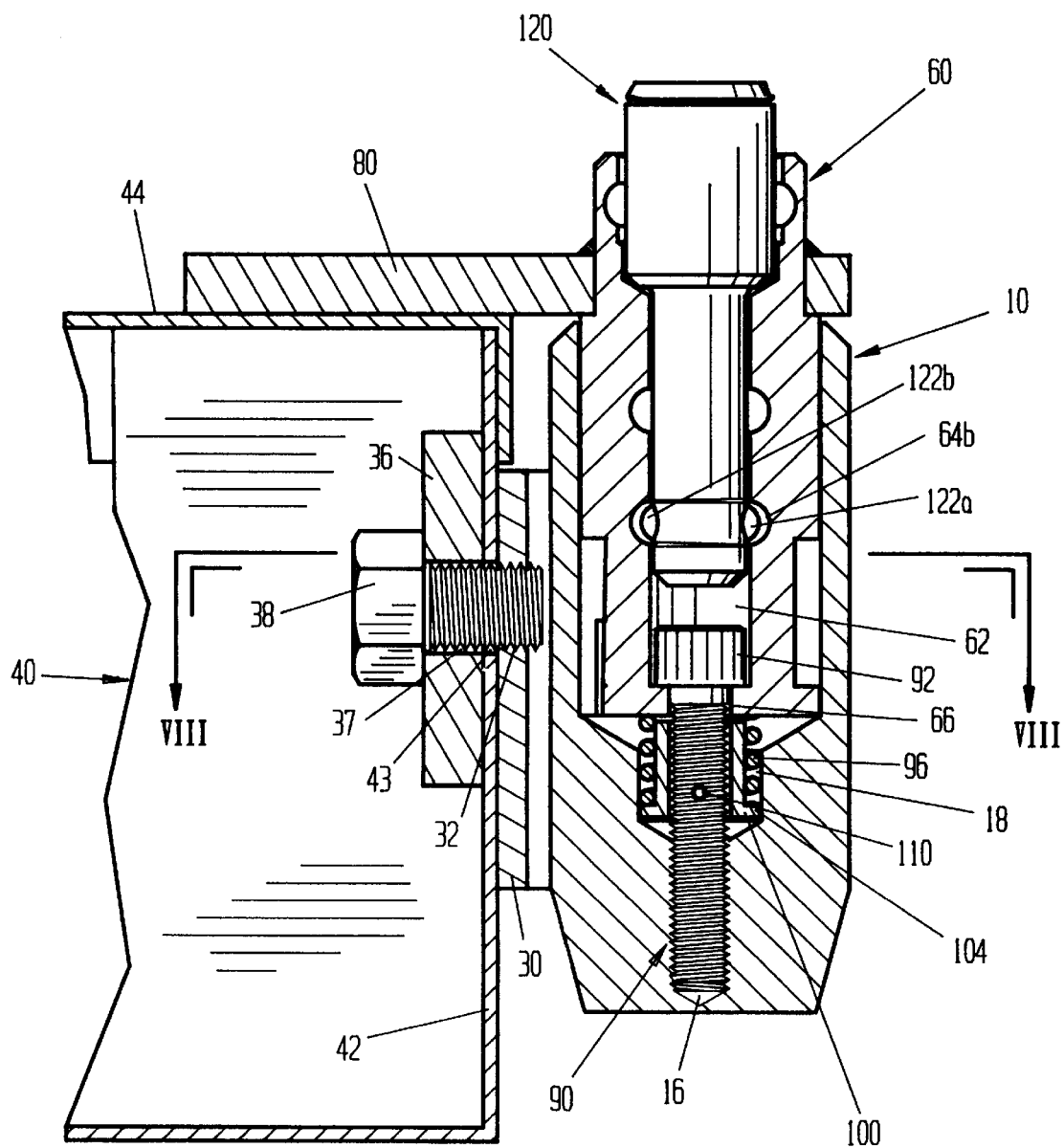
FIG. 3 shows a cross-sectional side view of the meter box lock shown in FIG. 1.

Referring to FIGS. 1 and 2, the meter box lock of the present invention includes an outer case 10, which is welded or otherwise rigidly attached to "C" shaped mounting channel 30 generally at 84. Together the outer case and the mounting channel form base member 28. The mounting channel 30 is anchored, by a bolt or other suitable means, to the sidewall 42 of an electric meter box or similar enclosure 40. Referring to FIGS. 2 and 3, the screw 38 passes through the hole 37 in the heavy washer 36 and the hole 43 in the sidewall 42, and is screwed into the threaded hole 32 in the mounting channel 30. The door 44 of the meter box is hinged generally at 46, as shown in FIG. 1, and includes a raised boss 48 which retains the electricity meter 50 in the box 40. Referring to FIG. 2, a heavy cover plate 80 is welded or otherwise rigidly attached to sleeve 60 generally at 82, to form bracket member 86. Referring to FIGS. 2 and 3, the central bore 12 in the outer case 10 receives the sleeve 60, and the cover plate 80 overlays the door 44 to prevent unauthorized access to the interior of the meter box. The sleeve 60 has a deep bore 62, which receives the barrel lock 120, and smaller diameter through hole 66 at the bottom of the deep bore. When the meter box lock is assembled, the cap screw 90 is inserted through the hole 66 in the sleeve 60, until the head 92 of the screw abuts the bottom of the deep bore 62. The compression spring 96 slides onto the bushing 100 until it abuts the flange 104. In other embodiments any yieldingly urging means may replace the spring. The bushing and spring then slide onto the screw 90 until the hole 106 in the bushing is aligned with hole 94 in the screw. Roll pin 110 is then inserted into the holes to attach the bushing to the screw.

Referring to FIG. 6, the outer case 10 further includes a smaller diameter bore 18 below the central bore 12, and a tapped hole 16 at the bottom of this smaller bore. On the inside diameter of the central bore 12 just above the smaller bore 18 are two elongated extruded stop portions 20 and 22, spaced about 90 degrees apart. The counterclockwise-most stop portion 20 is longer and extends farther toward the bore opening than the shorter stop portion 22. Referring to FIG. 2, the sleeve 60 has a smaller diameter portion 70 at its lower end, which terminates in a radially extending flange 72. The smaller diameter portion 70 provides clearance for the stop portions when the sleeve is inserted into the outer case 10. Referring to FIG. 7, the flange 72 has an arcuate cutout portion 74, which creates locating surfaces 76 and 78.

Referring to FIG. 3, when the meter box lock is in the locked position, the cap screw 90 is screwed into the tapped hole 16 in the outer case 10. In other embodiments, any suitable means could be used in place of the cap screw to retain the sleeve 60 in the outer case. The spring 96 and bushing 100 reside in the smaller bore 18 of the outer case 10. The cover plate 80 is tightly clamped on the door 44 of the meter box 40. The barrel lock 120 is inserted in the sleeve 60, and the locking balls 122a and 122b are engaged by groove 64b on the inside diameter of the deep bore 62. In other embodiments, any suitable means could be used to secure the barrel lock in the sleeve 60. As shown in FIG. 8, the cutout portion 74 is just large enough to span both extrusions 20 and 22, so that rotation of the sleeve 60 relative to the outer case 10 is prevented by contact between locating surface 76 and extrusion 22, and between locating surface 78 and extrusion 20.

Figure 4:
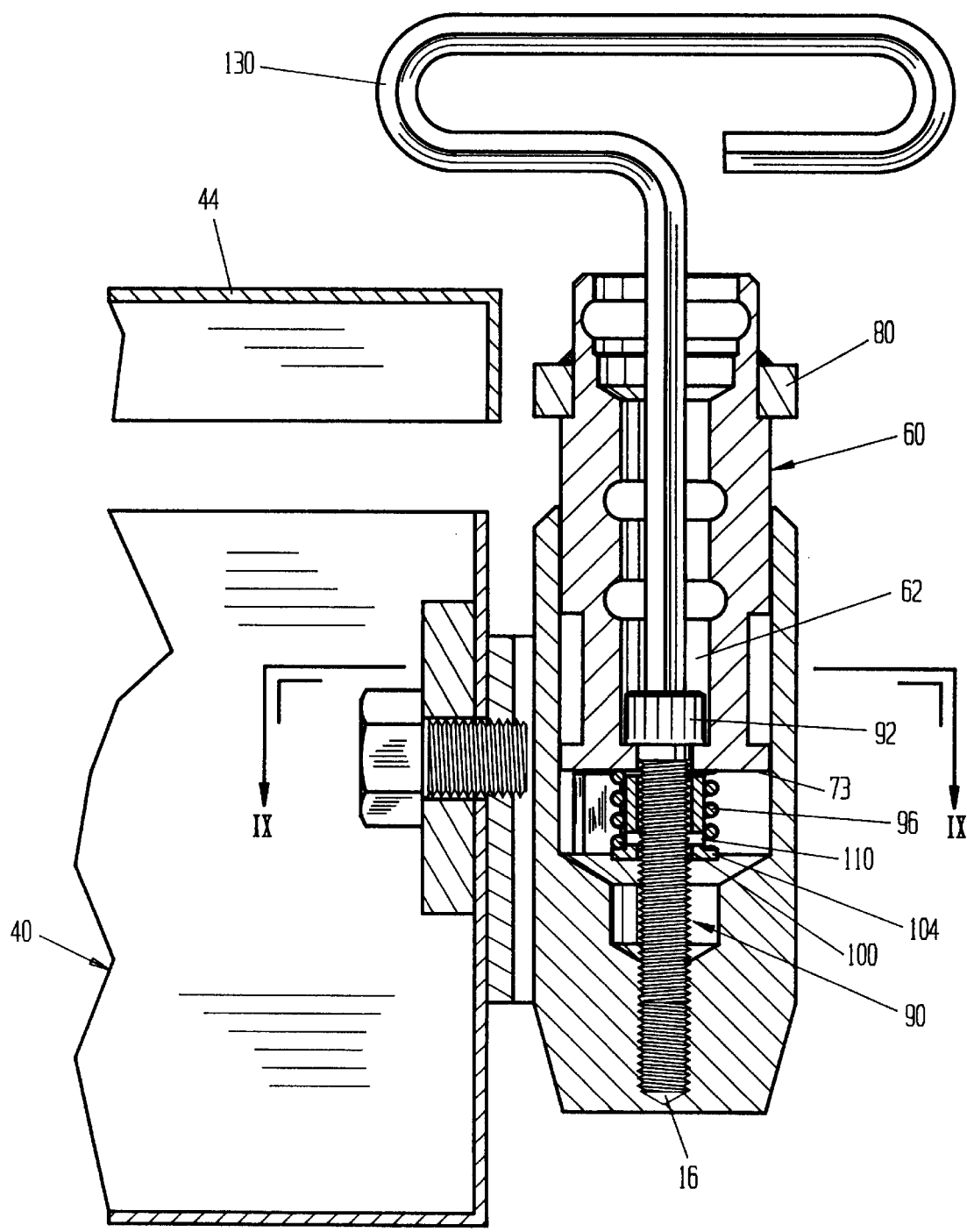
FIG. 4 shows a cross-sectional side view of the preferred embodiment meter box lock being opened by a hex key.

Referring to FIG. 4, when the meter box lock is unlocked, the barrel lock is removed so that the cap screw 90 can be unscrewed by the hex key 130. The axial motion of the cap screw is transmitted through the roll pin 110 to the bushing 100. Under normal conditions, this motion is then transmitted from the flange 104, through the compression spring 96, to the lower surface 73 of the sleeve 60, so that the sleeve rises with the cap screw 90. An axial force is also created between the head 92 of the cap screw and the bottom of the deep bore 62 in the sleeve. Referring to FIG. 5, when dirt, ice, or other contaminants prevent the free motion of the sleeve 60, the axial load between the flange 104 and the sleeve 60 increases greatly. The spring 96 is compressed until the top surface 108 of the bushing 100 contacts the lower surface 73 of the sleeve. In this configuration the axial load is transmitted directly from the bushing to the sleeve and bypasses the spring 96 entirely, thus preventing overstressing of the spring. In other embodiments the bushing may be replaced by any means which transfers the axial motion of the screw to the sleeve.

Referring to FIGS. 8 and 9, when the flange 72 of the sleeve 60 clears the shorter extrusion 22 in the outer case 10, the sleeve can be rotated via friction between the cap screw and the sleeve until locating surface 76 contacts the longer stop 20. In this configuration, shown in FIG. 4, the cover plate 80 is rotated about an axis perpendicular to the door 44 of the meter box 40, until the cover plate no longer overlays the door and the door can be opened. In other embodiments any other suitable coupling means could be used which allows rotation of the sleeve 60 within the outer case 10 when the sleeve is in a first axial position relative to the outer case, and prevents rotation of the sleeve within the outer case when the sleeve is in a second axial position relative to the outer case. When the meter box lock is relocked, the cap screw is screwed back into the tapped hole 16. The sleeve 60 is rotated, again via friction, to the position shown in FIG. 8, and the cap screw is turned until the cover plate 80 clamps tightly on the door 44 of the meter box 40. The barrel lock 120 is then reinstalled in the sleeve 60, as shown in FIG. 3. In other embodiments, the spring may be replaced by any means which imparts the rotation of the screw to the sleeve.

Figure 15:
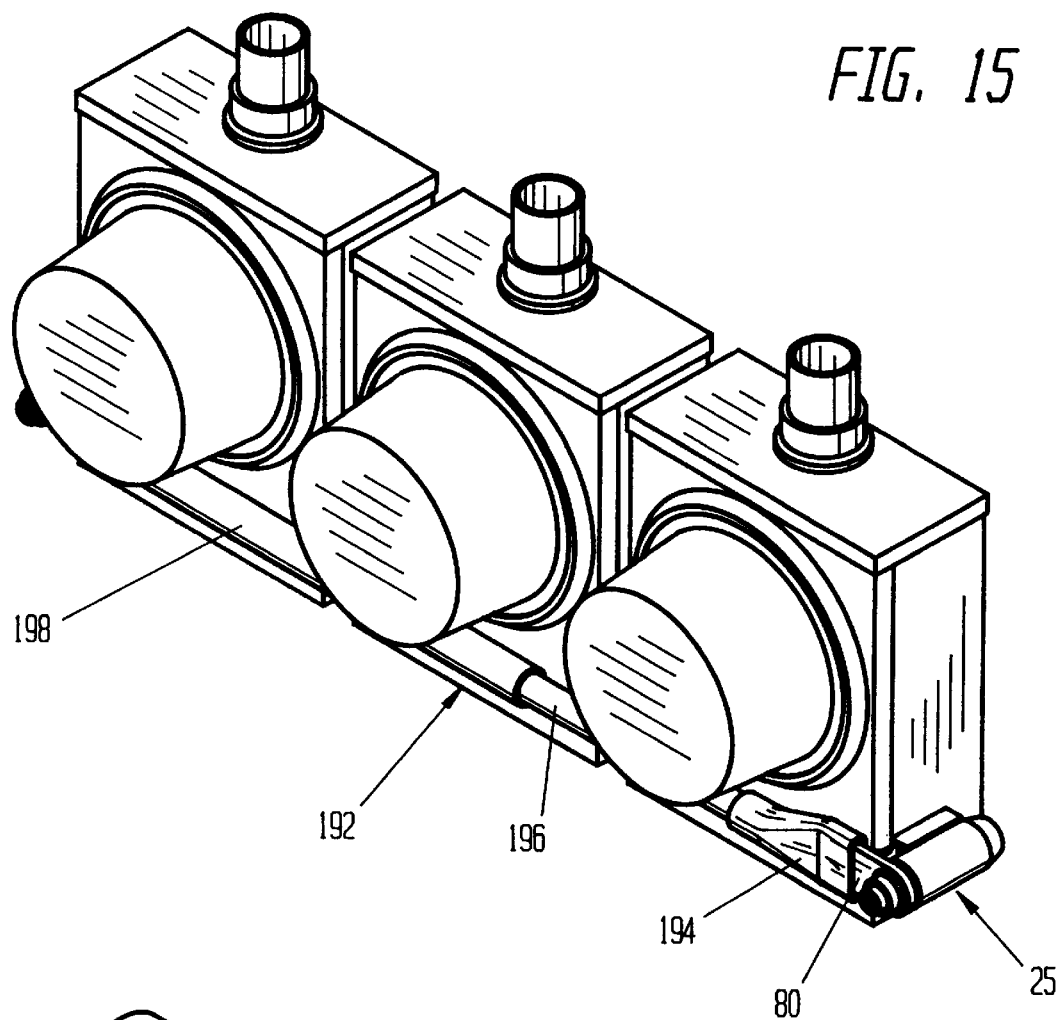
FIG. 15 shows an isometric view of the preferred embodiment meter box lock and a Johnny-Bar device securing a gang meter installation.
Figure 16:
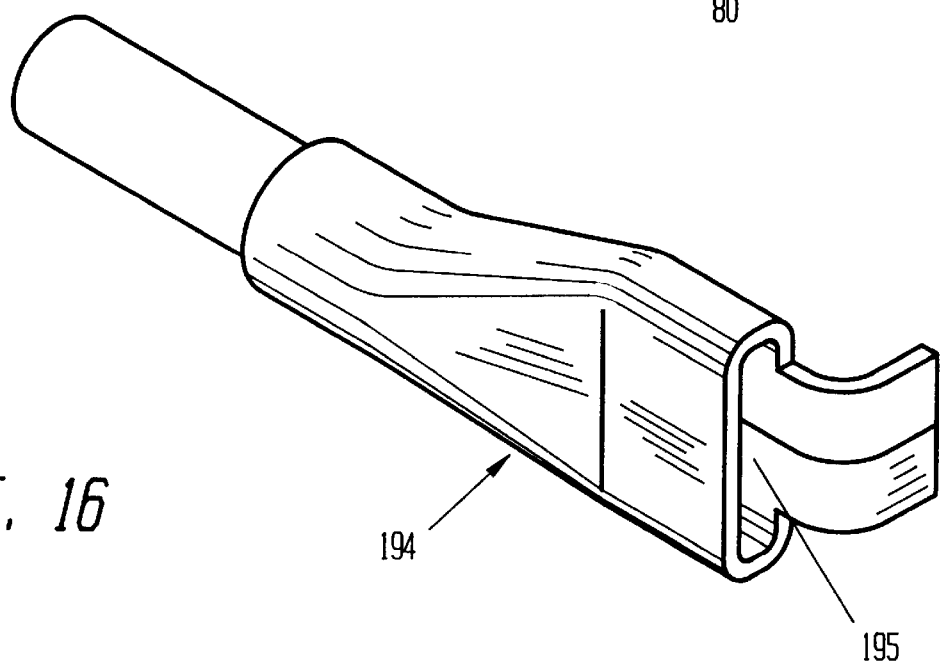
FIG. 16 shows an isometric view of the end of the Johnny-Bar device shown in FIG. 15.
Figure 17C:
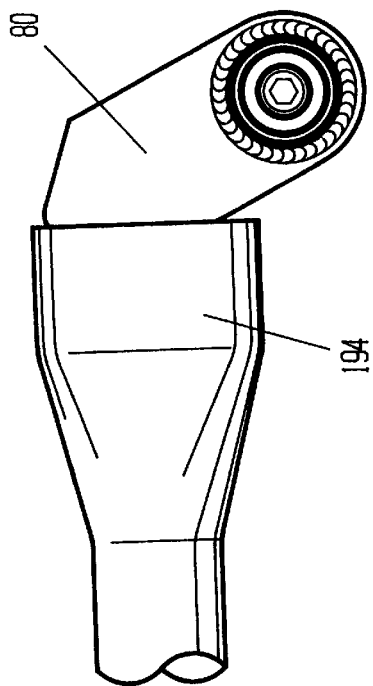
FIG. 17 shows four successive top views of the preferred embodiment meter box lock disengaging from the end of the Johnny-Bar device shown in FIG. 16.
Figure 17D:
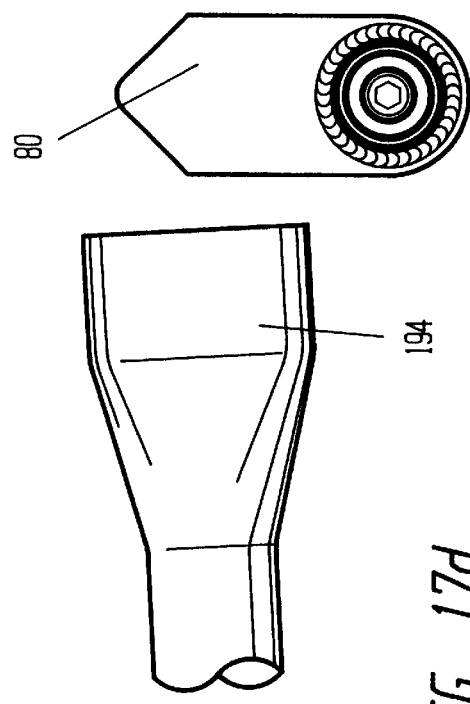
Figure 17A:
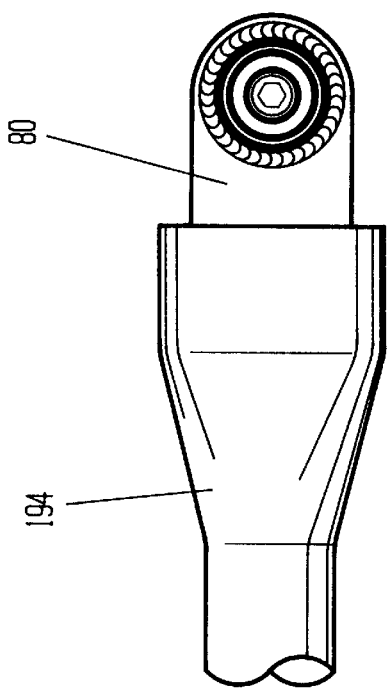
Figure 17B:
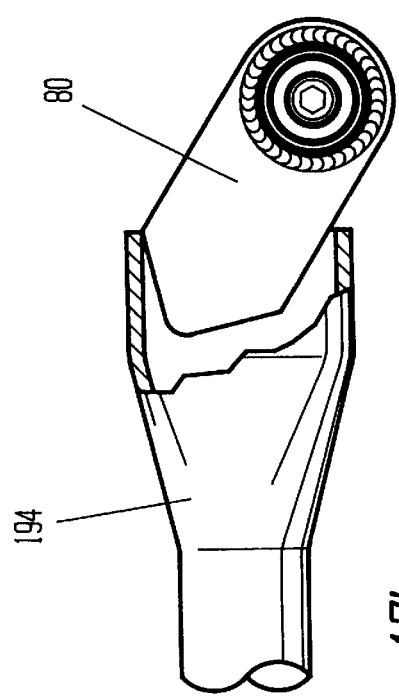

FIG. 15 shows the preferred embodiment meter box lock 25 used in conjunction with a Johnny-Bar device 192 in a multiple meter gang installation. The Johnny-Bar includes a small diameter pipe portion 196 and a large diameter pipe portion 198 which mate in a telescoping manner, and two end portions such as 194. Referring also to FIG. 16, each of the end portions such as 194 include an orifice or slot 195 which engages the cover plate portion 80 of the meter box lock 25. As shown in FIG. 2, the cover plate portion includes a tapered end portion 81. Referring to FIGS. 17a through 17d, this tapered end facilitates engagement and disengagement of the cover plate 80 with the end portion 194 as the cover plate is rotated to the open position. In other embodiments, any end portion configuration may be used which is sufficiently rounded, chamfered, or otherwise modified to facilitate engagement and disengagement with the Johnny-Bar device 192 or other device designed to engage the plate portion 80.

Alternative Embodiments

Figure 10:
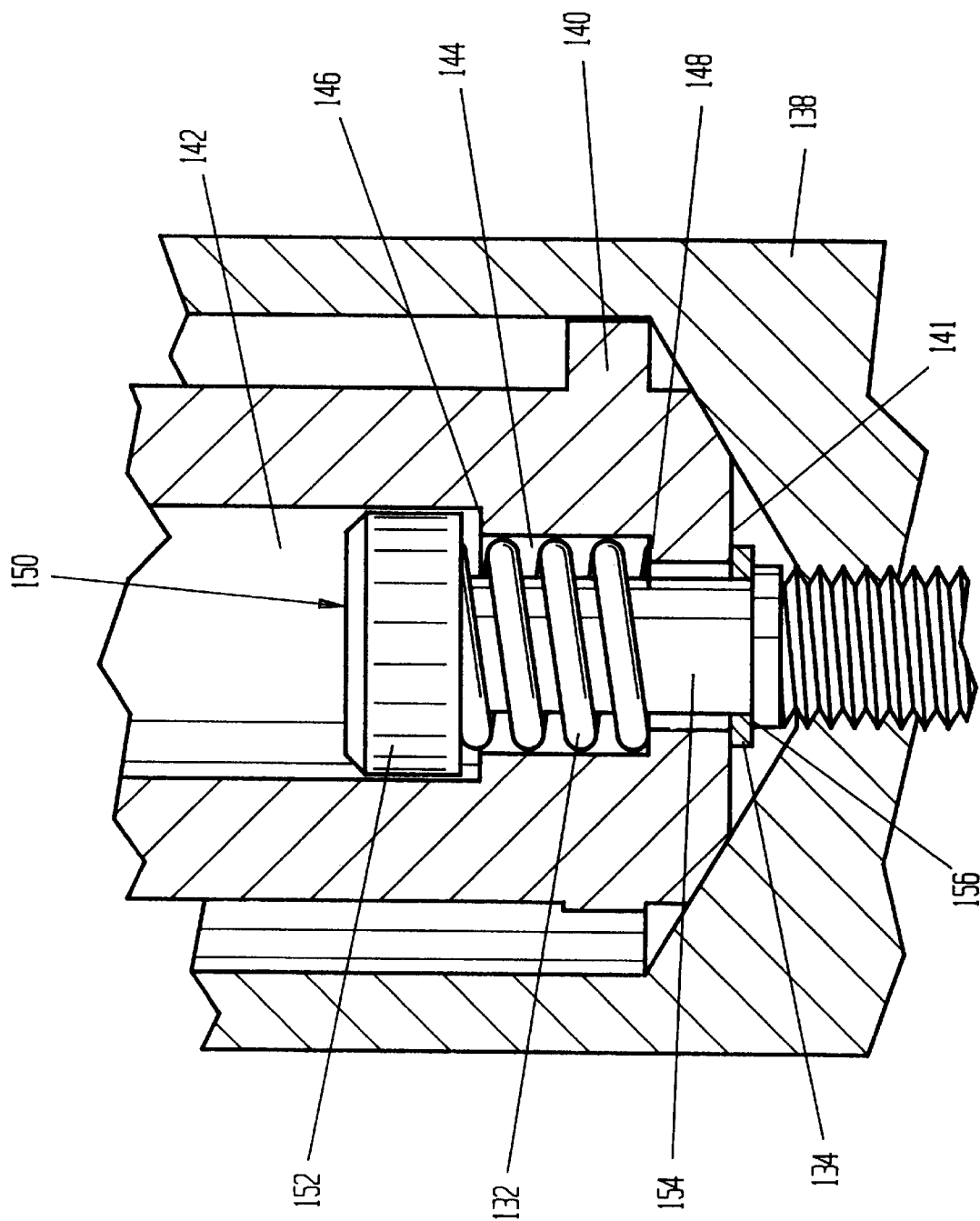
FIG. 10 shows a partial cross-sectional side view of an alternative embodiment meter box lock having a snap-ring and a spring mounted within the sleeve portion.

The alternative embodiment meter box lock shown in FIG. 10 includes an outer case 138, sleeve 140, and screw 150. The sleeve includes a deep bore 142 and a smaller diameter bore 144, creating internal shoulders 146 and 148, respectively. The screw 150 includes a head 152, a reduced diameter section 154, and an external shoulder 156. The snap ring 134 bears on the bottom surface 141 of the sleeve 140 and the shoulder 156, and serves to transfer the upwards axial motion of the screw 150 to the sleeve. The compression spring 132 resides in the smaller diameter bore 144 and bears on the head 152 of the screw and the internal shoulder 148. The spring maintains an axial force between the screw 150 and the sleeve 140, such that torque can be transmitted between the screw and sleeve via friction. To prevent damage to the spring when the screw is screwed down, the spring 132 is compressed until the head 152 contacts the internal shoulder 146 in the sleeve 140. In this way the downward axial motion of the screw 150 is transmitted directly to the sleeve 140, and the spring 132 is bypassed.

Referring to FIGS. 11 and 12, an alternative embodiment meter box lock includes an outer case 170 with a single stop portion 172. The sleeve 160 includes a cutout or slot 162 which receives the stop portion 172, and non-rotatably couples the sleeve to the case. Referring to FIG. 13, when the screw 90 is unthreaded, the sleeve 160 can be raised by the user. When the bottom surface 164 of the sleeve clears the top surface 174 of the extrusion 172, the sleeve can be rotated relative to the outer case 170. The cover plate 80, shown in FIG. 12, can then be moved to the open position, as in the preferred embodiment.

The alternative embodiment meter box lock shown in FIG. 14 is similar to the meter box lock shown in FIGS. 11 through 13. The present embodiment further includes a snap ring 134, which fits into groove 182 in screw 180. When the screw is screwed up, the snap ring bears on the external shoulder 183 on the screw and the bottom surface 164 of the sleeve 160. In this way, the upward axial motion of the screw 180 is transmitted to the sleeve. In other embodiments the snap ring could be replaced by any means projecting radially from the screw.

Figure 18:
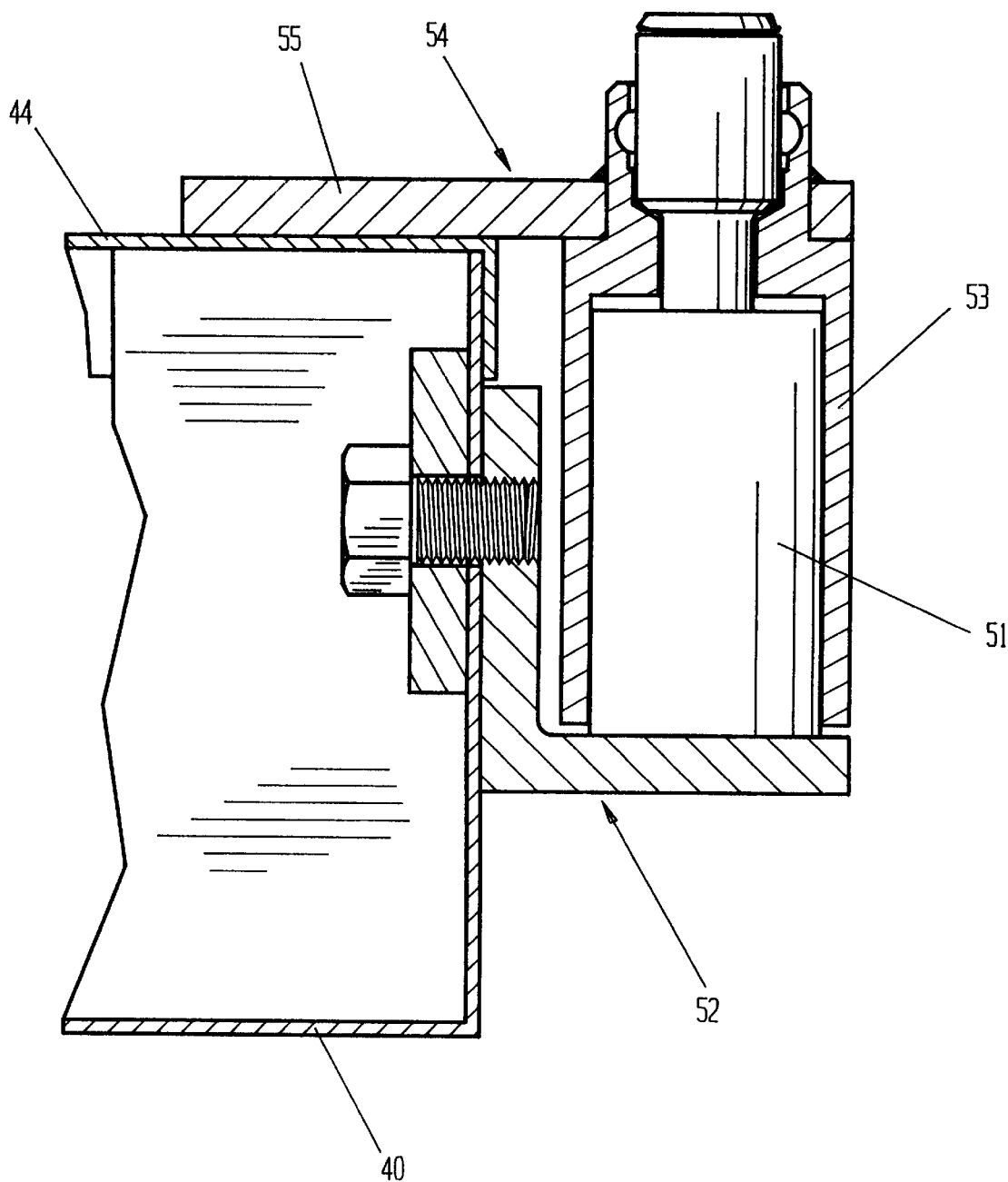
FIG. 18 shows a cross-sectional side view of an alternative embodiment meter box lock in which the sleeve is a part of the base member and the outer case is a part of the bracket member.

FIG. 18 shows an alternative embodiment meter box lock in which the sleeve portion 51 is part of the base member 52. The sleeve is inserted into the outer case 53, which is part of the bracket member 54. The cover plate 55 retains the door 44 of the meter box 40 in a manner similar to the preferred embodiment meter box lock.

Conclusions, Ramifications, and Scope of the Invention

The present invention, therefore, is well adapted to carry out the objects and attain the ends and advantages mentioned, as well as others inherent therein. All the components of the meter box lock of the present invention are constructed of case hardened steel to resist cutting or sawing, and the cover plate is made of heavy gage flat stock to prevent bending by prying. Thus the lock is highly resistant to tampering. The meter box lock of the present invention is easy to use because the lock remains assembled during normal operation, and the cover plate moves with the screw to its locked or unlocked position. The cover plate position is continuously adjustable via the screw, making installation position less critical. Finally, the sleeve rotates within the case to move the cover plate to the open position. Thus, the lock requires no additional clearance between the meter boxes.

While, for the purposes of disclosure there have been shown and described what are considered at present to be the preferred embodiments of the present invention, it will be appreciated by those skilled in the art that other uses may be resorted to and changes may be made to the details of construction, combination of shapes, size or arrangement of the parts, or other characteristics without departing from the spirit and scope of the invention. It is therefore desired that the invention not be limited to these embodiments and it is intended that the appended claims cover all such modifications as fall within the true spirit and scope of the invention.

What is claimed is:

1. A locking device for locking an enclosure having a sidewall and a cover oriented generally perpendicularly to said sidewall, said locking device including a base member having a mounting surface for mounting on said sidewall and a bracket member cooperative with said base member to prevent relative rotation of said bracket member and said base member when said locking device is locked, said bracket member having a plate portion for overlaying said cover when said locking device is locked, said plate portion being oriented generally perpendicularly to said mounting surface, said plate portion being rotatable relative to said base member about an axis generally perpendicular to said plate portion when said locking device is unlocked, said bracket member being continuously coupled to said base member when said plate portion is rotated, and said bracket member having at least one recess therein, said recess being adapted for receiving a barrel lock of the type having a generally cylindrical body with one or more retractable locking elements extending therefrom.

2. The locking device of claim 1 wherein said base member includes an outer case having a central bore and said bracket member further includes a sleeve portion insertable into said central bore, said locking device further including:
   (a) retaining means retaining said sleeve portion in said central bore; and
   (b) coupling means configured such that:
      (i) rotation of said sleeve portion relative to said outer case is prevented when said sleeve portion is in a first position along the axis of said outer case, and
      (ii) rotation of said sleeve portion relative to said outer case is allowed when said sleeve portion is in a second position along the axis of said outer case.

3. The locking device of claim 2 wherein said sleeve portion further includes:
   (a) a deep bore, and
   (b) securing means for securing a barrel lock in said deep bore, whereby access to said retaining means is impeded.

4. The locking device of claim 1 wherein said coupling means includes:
   (a) one or more stop portions projecting generally radially into said central bore of said outer case, and
   (b) a generally radially extending flange on said sleeve portion, said flange having an arcuate cutout portion which engages at least one of said stop portions when said sleeve portion is in said first position.

5. The locking device of claim 4 wherein said stop portions are formed by offsetting the outer case material.

6. The locking device of claim 4 wherein:
   (a) said sleeve portion further includes a deep bore and a shoulder portion within said deep bore,
   (b) said outer case further includes a threaded hole at the bottom of said central bore, and
   (c) said retaining means includes screw means engaging said shoulder portion and said threaded hole.

7. The locking device of claim 6 further including motion transferring means which transfers the axial motion of said screw means to said sleeve portion when said screw means is unscrewed from said threaded hole in said outer case.

8. The locking device of claim 7 further including rotation imparting means which impart the rotation of said screw means to said sleeve portion when said sleeve portion is in said second position.

9. The locking device of claim 8, wherein said screw means is rotatable relative to said sleeve portion when said sleeve portion is in said first position.

10. The locking device of claim 9 wherein said rotation imparting means includes yieldingly urging means for maintaining an axial force between said screw means and said sleeve portion, whereby said screw means may be rotatively coupled to said sleeve portion via friction.

11. The locking device of claim 4 wherein:
   (a) said coupling means includes a short stop portion and a long stop portion in said central bore,
   (b) said arcuate cutout portion on said flange of said sleeve portion spans both stop portions when said sleeve portion is in said first position, whereby said sleeve portion is prevented from rotating relative to said outer case,
   (c) said cutout on said sleeve portion does not engage said short stop portion when said sleeve portion is in said second position.

12. The locking device of claim 6 further including:
   (a) a generally cylindrical bushing mounted about said screw means and adjacent to said sleeve portion, said bushing having an external, radially extending flange,
   (b) yieldingly urging means mounted generally coaxially about said bushing, such that said yieldingly urging means is compressed between said sleeve portion and said flange.

13. The locking device of claim 10 wherein:
   (a) said rotation imparting means includes:
      (i) a second, smaller diameter bore at the bottom of said deep bore in said sleeve portion, creating a second shoulder portion in said sleeve portion, and
      (ii) yieldingly urging means mounted generally coaxially about said screw means and fitting into said smaller diameter bore, such that said yieldingly urging means is compressed between the head of said screw means and said second shoulder portion; and
   (b) said motion transferring means includes projecting means extending radially outward from said screw means, said projecting means being positioned adjacent to the bottom of said sleeve portion and having a larger diameter than said screw means.

14. The locking device of claim 1 wherein said bracket member further includes an outer case having a central bore and said base member includes a sleeve portion insertable into said central bore, said locking device further including:
   (a) retaining means retaining said sleeve portion in said central bore; and
   (b) coupling means configured such that:
      (i) rotation of said outer case relative to said sleeve portion is prevented when said outer case is in a first position along the axis of said sleeve portion, and
      (ii) rotation of said outer case relative to said sleeve portion is allowed when said outer case is in a second position along the axis of said sleeve portion.

15. The locking device of claim 1, wherein said plate portion intersects said axis, said plate portion having a width extending perpendicularly to said axis, and a thickness extending along said axis, said width being substantially greater than said thickness where said plate portion intersects said axis, and said plate portion being generally elongate and including an end portion disposed generally away from said axis.

16. The locking device of claim 15 wherein said end portion is tapered, rounded, or chamfered such that the furthest extent of said plate portion from said axis of rotation is along a line generally through the center of said plate portion and intersecting said axis of rotation.

\* \* \* \* \*